United States Patent [19]
Stoner et al.

[11] Patent Number: 5,652,436
[45] Date of Patent: Jul. 29, 1997

[54] SMOOTH DIAMOND BASED MESA STRUCTURES

[75] Inventors: Brian R. Stoner, Chapel Hill; Joseph S. Holmes, Jr., Sanford; David L. Dreifus, Cary, all of N.C.; Scott R. Sahaida, Phoenix, Ariz.; Roy E. Fauber, Chapel Hill, N.C.; Michelle L. Hartsell, Plano, Tex.; Dean Malta, Cary, N.C.

[73] Assignee: Kobe Steel USA Inc., Research Triangle Park, N.C.

[21] Appl. No.: 514,656

[22] Filed: Aug. 14, 1995

[51] Int. Cl.⁶ ................................................ H01L 31/0312
[52] U.S. Cl. ............................ 257/77; 257/416; 257/623
[58] Field of Search ............................ 257/77, 416, 623

[56] References Cited

U.S. PATENT DOCUMENTS

| | | | |
|---|---|---|---|
| 3,761,783 | 9/1973 | Kroger et al. | 317/234 R |
| 3,816,194 | 6/1974 | Kroger et al. | 156/3 |
| 3,849,217 | 11/1974 | Kroger et al. | 156/11 |
| 3,896,473 | 7/1975 | DiLorenzo et al. | 357/15 |
| 3,925,078 | 12/1975 | Kroger et al. | 96/36.2 |
| 4,643,161 | 2/1987 | Kim | 125/30 R |
| 4,952,832 | 8/1990 | Imai et al. | 310/313 A |
| 4,966,862 | 10/1990 | Edmond | 437/100 |
| 5,006,914 | 4/1991 | Beetz, Jr. | 357/61 |
| 5,066,938 | 11/1991 | Kobashi et al. | 338/22 |
| 5,073,230 | 12/1991 | Maracas et al. | 156/631 |
| 5,272,104 | 12/1993 | Schrantz et al. | 437/63 |
| 5,329,208 | 7/1994 | Imai et al. | 310/313 R |
| 5,334,342 | 8/1994 | Harker et al. | 264/317 |
| 5,355,568 | 10/1994 | Imai et al. | 29/25.35 |
| 5,391,895 | 2/1995 | Dreifus | 257/77 |
| 5,420,443 | 5/1995 | Dreifus et al. | 257/77 |

OTHER PUBLICATIONS

Tong et al., "Silicon Carbide Wafer Bonding", J. Electrochem. Soc., vol. 142, No. 1, Jan. 1995, pp. 232–236.

Katsumata et al., "Patterning of CVD Diamond Films by Seeding and Their Field Emission Properties", Diamond and Related Materials, vol. 3, 1994, pp. 1296–1300.

Geis, "Diamond Transistor Performance and Fabrication", Proceedings of the IEEE, vol. 79, No. 5, May 1991, p. 669–676.

Gildenblat et al., "High–Temperature Thin–Film Diamond Field–Effect Transistor Fabricated Using a Selective Growth Method", IEEE Electron Device Letters, vol. 12, No. 2, Feb. 1991, pp. 37–39.

Inoue et al., "Selected–Area Deposition of Diamond Films", J. Appl. Phys., vol. 67, No. 12, Jun. 15, 1990, pp. 7329–7336.

Davidson et al., "Selective Deposition of Diamond Films", Journal of Electronic Materials, vol. 18, No. 6, 1989, pp. 711–715.

Hirabayashi et al., "Selective Deposition of Diamond Crystals by Chemical Vapor Deposition Using a tungsten–Filament Method", Appl. Phys. Lett., vol. 53, No. 19, Nov. 7, 1988, pp. 1815–1817.

*Primary Examiner*—Minh-Loan Tran
*Attorney, Agent, or Firm*—Bell, Seltzer, Park & Gibson

[57] ABSTRACT

A diamond-based structure includes a substrate, an adhesive material on a face of the substrate, and an array of spaced apart diamond mesas bonded to the substrate by the adhesive material. In particular, each of the diamond mesas can have a growth surface adjacent the substrate and an interfacial surface opposite the substrate, and the interfacial surface can be smooth relative to the growth surface. This structure can be fabricated by providing a sacrificial substrate, forming a plurality of diamond mesas on a face of the sacrificial substrate, bonding the diamond mesas to a transfer substrate, and removing the sacrificial substrate. Accordingly, the interfacial surfaces of the diamond, which are formed adjacent the sacrificial substrate and then exposed by removing the substrate are smooth.

14 Claims, 4 Drawing Sheets

SMOOTH DIAMOND BASED MESA STRUCTURES

FIELD OF THE INVENTION

The present invention relates to diamond-based structures and methods, and more particularly to diamond-based structures and methods including diamond mesas.

BACKGROUND OF THE INVENTION

Diamond is a preferred material for microelectronic devices because it has semiconductor properties that are superior to conventional semiconductor materials, such as silicon, germanium or gallium arsenide. Diamond provides a higher energy bandgap, a higher breakdown voltage, and a higher saturation velocity than these traditional semiconductor materials.

These properties of diamond yield a substantial increase in projected cutoff frequency and maximum operating voltage compared to devices fabricated using more conventional semiconductor materials. For example, silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C. in vacuum.

Diamond also has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, that is, diamond is a "radiation-hard" material. Diamond is also relatively chemically inert. Diamond is also optically transparent and mechanically hard. Accordingly, diamond can be used advantageously in optical applications, and its mechanical hardness means that it is robust and can be used as an extremely effective abrasive agent. These mechanical properties also produce excellent acoustic characteristics.

Because of the advantages of diamond as a material for microelectronic devices, there is at present an interest in the growth and use of diamond for devices which can be used in environments which are subjected to high temperatures, radiation, and/or corrosive agents. For example, there is an interest in the use of diamond for Surface Acoustic Wave ("SAW") devices because of the high velocity of surface acoustic waves through diamond. SAW devices including diamond layers are discussed in U.S. Pat. Nos. 5,329,208, 5,355,568, and 4,952,832, all to Imai et al.

Unfortunately, the fabrication of a single crystal diamond film is typically carried out by homoepitaxial deposition of a semiconducting diamond film on a single crystal diamond substrate. Such a single crystal diamond substrate is relatively expensive. In addition, large single crystal substrates may not be available for many applications.

A proposed microelectronic device having one or more semiconductor devices formed on a single crystal substrate, such as diamond, is described in U.S. Pat. No. 5,006,914 entitled "Single Crystal Diamond Substrate Articles and Semiconducting Device Comprising Same" to Beetz, Jr. et al. This patent discloses a microelectronic structure including a single crystal diamond substrate which is etched to form an array of spaced apart posts of single crystal diamond. On each post is grown a semiconducting layer of single crystal diamond to serve as an active channel region of a respective semiconductor device. Unfortunately, the use of a large single crystal diamond substrate as the starting point for the fabrication of the Beetz structure is relatively expensive.

Another microelectronic structure is described in U.S. Pat. No. 5,420,443 entitled "Microelectronic Structure Having An Array Of Diamond Structures On A Nondiamond Substrate And Associated Fabrication Methods" to Dreifus et al. The '443 patent is assigned to the assignee of the present invention, and it represents a significant advance in the state of the art. The '443 patent and the present invention also share common inventors.

The microelectronic structure of the '443 patent includes a single crystal non-diamond substrate, and a plurality of laterally spaced apart diamond structures are formed on the substrate extending outwardly therefrom. An interfacial carbide layer is preferably formed between the plurality of diamond structures and the non-diamond substrate, and the diamond structures are substantially oriented with respect to the non-diamond substrate. The diamond structures preferably have a substantially flat outermost face having a (100)-orientation to thereby provide a relatively large usable area in contrast to other crystalline orientations. The embodiment of the method of this patent provides nucleation of an array of diamond structures, each approaching single crystal quality without scratching or abrading the surface of the substrate.

Notwithstanding the above mentioned references, there continues to exist a need in the art for improved diamond structures which can be used in the fabrication of microelectronic devices. There also exists a need in the art for diamond structures which can be produced economically.

SUMMARY OF THE INVENTION

In view of the foregoing background, it is therefore an object of the present invention to provide improved diamond-based structures and associated methods for making diamond-based devices.

It is another object of the present invention to provide improved surface acoustic wave devices.

These and other objects, features, and advantages of the present invention are provided by a diamond-based structure wherein an array of spaced apart diamond mesas are formed on a sacrificial substrate, bonded to a transfer substrate, and removed from the sacrificial substrate so that the smooth interfacial surface of each diamond mesa is exposed opposite the transfer substrate. In particular, randomly oriented polycrystalline diamond mesas with smooth exposed surfaces can be efficiently produced.

Microelectronic devices can be mass produced on the interfacial surfaces of the diamond mesas and separated by dicing the transfer substrate. Because the diamond mesas are spaced apart on the transfer substrate, dicing can be accomplished by sawing through the transfer substrate between the diamond mesas. The smoothness of the exposed interfacial surfaces allows the use of high resolution photolithography to produce microelectronic devices with fine geometries. The smoothness of the exposed interfacial surfaces may also reduce the need to polish the diamond mesas thereby reducing the cost of manufacturing microelectronic devices.

The diamond mesa structure of the present invention can be provided by forming a plurality of diamond mesas on the face of a sacrificial substrate, wherein each of the diamond mesas has a respective interfacial surface adjacent the sacrificial substrate and a respective growth surface opposite the sacrificial substrate. The growth surfaces of the diamond mesas are bonded to a transfer substrate, and the sacrificial substrate is removed from the diamond mesas thereby exposing the interfacial surfaces of the diamond mesas opposite the transfer substrate. The bonding step can include the steps of dispensing an adhesive material between the diamond mesas and the transfer substrate and joining the two. In addition, an adhesive protection layer can be formed between the adhesive material and the sacrificial substrate. This adhesive protection layer can protect the adhesive material when the sacrificial substrate is removed, and can also promote adhesion between the diamond mesas and the adhesive material. The adhesive material may itself form the transfer substrate. For example, the adhesive material may be dispensed and cast, to also form the transfer substrate.

The resulting structure can include a substrate, an adhesive material on a face of the substrate, and an array of spaced apart diamond mesas bonded to the substrate by the adhesive material. In addition, the adhesive material can fill the spaces between adjacent diamond mesas so that a surface of the adhesive material and surfaces of the diamond mesas define a continuous smooth top surface of the microelectronic structure. Accordingly, the microelectronic structure can be handled as a conventional microelectronic structure with no special precautions being required during subsequent processing.

The exposed interfacial surfaces of the diamond mesas can be smooth even if the mesas are polycrystalline diamond because these interfacial surfaces were formed against the sacrificial substrate. Accordingly, microelectronic devices requiring precise photolithographic processing can be produced on these diamond mesas. For example, surface acoustic wave devices can be produced by forming a layer of a piezoelectric material on the diamond mesas, and forming at least one pair of interdigitated electrodes on the piezoelectric material opposite each of the diamond mesas. The smooth diamond mesas allow the use of precise photolithographic processing thereby allowing the production of very closely spaced interdigitated electrodes. The closely spaced electrodes provide a high frequency surface acoustic wave device.

In one embodiment, the diamond-based structure can be stored before removing the sacrificial substrate. The resulting diamond-based structure has a sacrificial substrate, an array of spaced apart diamond mesas on a face of the sacrificial substrate, and a transfer substrate on the plurality of diamond mesas opposite the sacrificial substrate. Accordingly, the interfacial surfaces of the diamond mesas are protected until needed. The sacrificial substrate can be removed when the structure is needed for further processing such as fabricating microelectronic devices on the diamond mesas.

The methods and structures of the present invention can be used to provide high quality diamond surfaces for use in the production of microelectronic or other devices. In particular, the resulting diamond mesas are smooth allowing the mass production of microelectronic devices such as surface acoustic wave devices having small geometries. In addition, the diamond mesas can be separated without dicing through diamond. By avoiding the need to dice through diamond, high temperature and/or high pressure cutting operations are avoided. These operations may crack or otherwise degrade the remainder of the structure. Finally, the transfer substrate can be relatively thick, so that the diamond mesas are on a mechanically robust substrate. The diamond mesas themselves can thus be relatively thin and of high quality, yet the entire structure is mechanically robust.

DETAILED DESCRIPTION OF THE PREFERRED EMBODIMENTS

Figure 1:
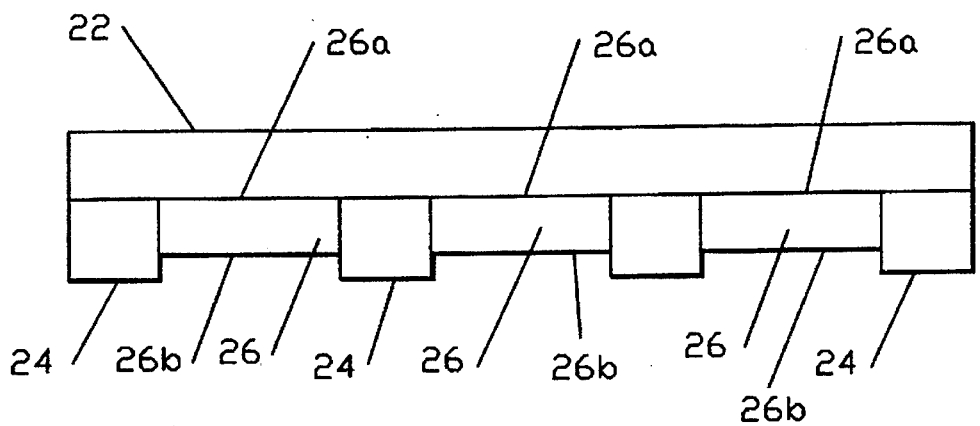
FIGS. 1-6 are cross-sectional views of diamond mesa structures illustrating steps in a method according to the present invention.

The present invention will now be described more fully hereinafter with reference to the accompanying drawings, in which preferred embodiments are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of the layers and regions are exaggerated for clarity. Like numbers refer to like elements throughout.

Diamond mesa structures can be fabricated according to the present invention as illustrated in FIGS. 1-9. As shown in FIG. 1, an array of diamond mesas 26 are formed on a smooth face of sacrificial substrate 22. The sacrificial substrate can be a semiconductor (such as silicon or silicon carbide) substrate, a metal (such as molybdenum) substrate, a ceramic (such as alumina) substrate, a glass (such as quartz, borosilicate glass or pyrex) substrate or another substrate known to those having skill in the art. The diamond mesas 26 can be formed by selectively exposing portions of the sacrificial substrate 22 through a mask layer 24 and selectively depositing diamond on the exposed portions of the sacrificial substrate 22. The mask layer can be silicon dioxide, silicon nitride, or any other masking material known to those having skill in the art. The selective deposition of diamond is discussed, for example, in the following references: Inoue et al., *Selected-Area Deposition of Diamond Films*, J.Appl. Phys., vol. 60, no. 12, 15 Jun. 1990; Davidson et al., *Selective Deposition of Diamond Films*, J.Elec.Matls. vol. 18, no.6, 1989; and Hirabayashi et al., *Selective Deposition of Diamond Crystals By Chemical Vapor Deposition Using A Tungsten-Filament Method*, Appl.Phys.Lett., vol. 53, no. 19, 7 Nov. 1988.

The diamond mesas 26 can also be formed by providing a plurality of diamond mesa growth regions having a high density of diamond nucleation sites, and selectively depositing diamond on these mesa growth regions. For example, a photoresist mixture including diamond grains with diameters on the order of 5 nm can be dispensed on the sacrificial substrate 22 and selectively removed from regions where diamond is not desired. Accordingly, the photoresist mixture is left only in the diamond mesa growth areas, and the density of diamond grains in these areas is preferably at least $10^7$ diamond grains/$cm^2$.

The diamond is then deposited using the diamond grains (or seeds) as nucleation sites. The photoresist can then be burned off leaving the diamond grains, or a carbon based photoresist can be converted into diamond-like material which will become part of the structure. Because the diamond grains are small and closely spaced in the diamond mesa growth areas, the resulting diamond mesas will have smooth interfacial surfaces 26a adjacent the sacrificial substrate 22. Selective seeding for growing diamond on Silicon substrates is discussed for example in the reference by Katsumata et al. entitled *Patterning Of CVD Diamond Films By Seeding And Their Field Emission Properties,* Diamond and Related Materials, Vol. 3, (1994), pp. 1296–1300. The nucleation density can also be controlled by forming a layer of diamond-like material such as diamond-like carbon (DLC) on the sacrificial substrate. The DLC layer can have a large number of closely-spaced nucleation sites, resulting in smooth diamond surfaces.

Accordingly, the smoothness of the interfacial surfaces 26a can be controlled at least in part by the size of the diamond grains in the photoresist, the density of the diamond grains in the mesa growth regions, and the smoothness of the sacrificial substrate. As a result, the diamond mesas 26 can have interfacial surfaces 26a that are smooth relative to the growth surfaces 26b. In fact, the resulting interfacial surfaces 26a can have a roughness that is preferably less than 0.1 µm RMS and most preferably less than 0.01 µm.

Each of the diamond mesas 26 includes an interfacial surface 26a adjacent the sacrificial substrate 22 and a growth surface 26b opposite the substrate. Because the interfacial surfaces 26a are formed along the sacrificial substrate 22 as the diamond mesas 26 are deposited, the smoothness of these surfaces is dependent, at least in part, on the smoothness of the sacrificial substrate 22. As discussed above, the smoothness of the interfacial surfaces can also be dependent on the density of nucleation sites and the size of diamond grains and the density of the diamond grains making up the nucleation sites. By using a highly polished sacrificial substrate, the interfacial surfaces of the diamond mesas 26 can be very smooth. For example, the interfacial surfaces 26a of randomly oriented polycrystalline diamond mesas can have a roughness of less than 0.1 µm RMS and preferably less than 0.01 µm RMS despite the fact that the growth surfaces 26b of the randomly oriented diamond mesas 26 can be significantly rougher.

The smoothness of the interfacial surfaces 26b of the diamond mesas 26 can be further enhanced by depositing the diamond at a first relatively slow deposition rate in order to increase the cohesion of the interfacial surfaces 26b to the sacrificial substrate 22. The growth rate can be increased once the exposed portions of the sacrificial substrate 22 are completely covered by diamond thereby reducing the time required to form the diamond mesas 26. Alternatively, the smoothness of the interfacial surfaces 26b can be enhanced by forming diamond-like material on the sacrificial substrate at a relatively high rate, and then forming diamond mesas on the diamond-like material at a relatively slow rate. Other variable growth rate processes can be used to enhance the quality and growth rate of the diamond mesas.

Figure 2:
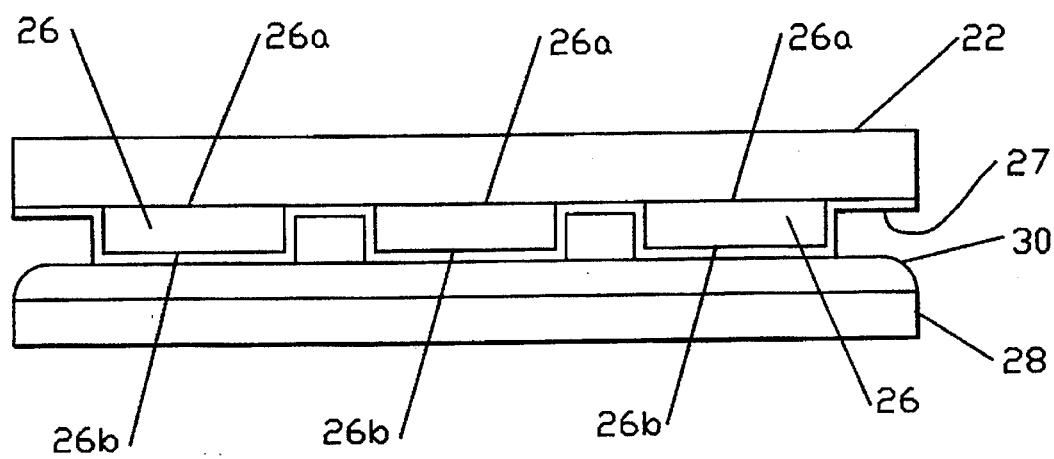

As shown in FIG. 2, a transfer substrate 28 is provided adjacent the diamond mesas 26, and an adhesive material 30 is dispensed between the diamond mesas 26 and the transfer substrate 28. The transfer substrate 28 can be a semiconductor (such as silicon or silicon carbide) substrate, a metal (such as molybdenum) substrate, a ceramic (such as alumina) substrate, a glass substrate (such as a quartz substrate, a borosilicate glass substrate, or pyrex) or another substrate known to those having skill in the art. The adhesive material can be an inorganic-based compound (for example, cements and ceramic adhesives); thermosets (for example, acrylics, anaerobics, cyanoacrylates, epoxies, polybenzimidazole, polyesters, polyimides, polyurethanes, silicones, and urea and melamine formaldehydes); thermoplastics (for example, acrylics, cellulose acetate, cellulose nitrate, ethylene-vinyl-acetate/polyolefin, phenoxy, polyvinyl acetate, polyvinyl alcohol and polyamides); elastomers (for example, butyl rubber, natural rubber, neoprene, polyisobutylene, polysulfide, polyurethane, reclaimed rubber, and silicone); and alloys (for example, combinations of resins from two or more chemical groups from among thermosets, thermoplastics, and elastomers). The choice of adhesive depends on the temperature and environmental requirements for subsequent device processing. An example of a commercially available adhesive is Ceramabond 569 from Aremco, Inc. The substrates and adhesive materials listed above are provided only for the purposes of description, other substrates and adhesive materials being known to those having skill in the art.

The adhesive material 30 can also form the transfer substrate. Thus, for example, in FIG. 2 adhesive material 30 may be dispensed and cast to form a relatively thick transfer substrate, in addition to adhering to the diamond mesas 26. In this case, a separate transfer substrate 28 may not be needed.

In addition, an adhesive protection layer 27, such as silicon nitride, can be provided on the diamond mesas 26 and exposed portions of the sacrificial substrate 22. As shown in FIG. 2, the adhesive protection layer 27 can be formed by depositing a material such as silicon nitride on the exposed surfaces of the sacrificial substrate 22 and the diamond mesas 26. The adhesive protection layer 27 can be used to protect the adhesive material during the later step of removing the sacrificial substrate, and can protect the adhesive material 30 from degradation due to contact with oxygen, bacteria, etc. This layer can also be used to promote adhesion of the diamond mesas to the adhesive material.

Figure 3:
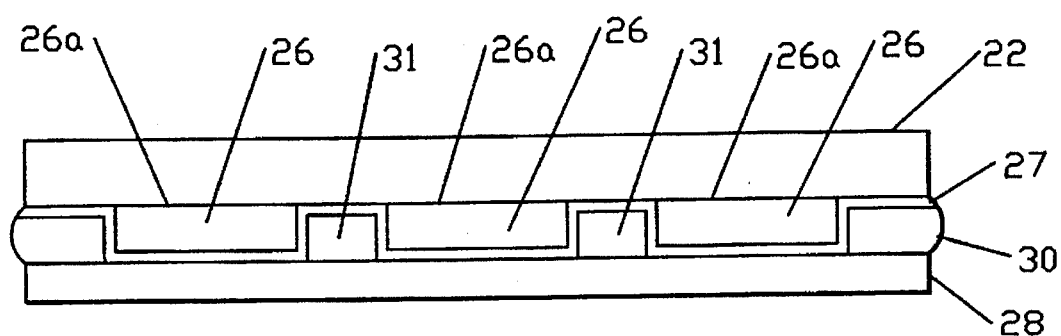

The diamond mesas 26 are embedded in the adhesive material 30 on the transfer substrate 28, as shown in FIG. 3. If an adhesive protection layer 27 is used, the adhesive material can be separated from the diamond mesas 26 and the sacrificial substrate 22 as discussed above. The adhesive material 30 is allowed to set so that the growth surfaces 26b of the diamond mesas 26 are bonded with the transfer substrate 28. Because the diamond mesas 26 remain attached to the sacrificial substrate 22 while the adhesive material 30 sets, the interfacial surfaces 26a of the diamond mesas 26 are in a common plane. Accordingly, by maintaining the sacrificial and transfer substrates in a parallel orientation during the bonding process, the diamond mesas 26 can be bonded to the transfer substrate so that the interfacial surfaces 26a are in a common plane parallel to the transfer substrate. Alternately, the diamond mesas can be bonded to the transfer substrate, for example, by a silicide bonding method as disclosed in U.S. Pat. No. 5,272,104 to Schrantz et al. entitled "Bonded Wafer Process Incorporating Diamond Insulator," the disclosure of which is hereby incorporated herein in its entirety by reference. Other bonding techniques known to those having skill in the art such as anodic bonding may also be used.

As shown, voids 31 are defined by the sides of adjacent diamond mesas 26 and the surfaces of the two substrates. These voids between adjacent diamond mesas 26 are preferably filled with the adhesive material 30, so that the adhesive material surrounds each of the diamond mesas 26 bonding them securely in place. When the void is filled with the adhesive material, the top surface of the adhesive material is adjacent the smooth surface of the sacrificial substrate 22. Accordingly, the adhesive material will have a smooth surface that is level with the interfacial surfaces 26a of the diamond mesas 26. Alternatively, the adhesive material may also be present on the diamond mesas 26 adjacent transfer substrate 28. This adhesive material can be removed using chemical-mechanical polishing or other known techniques. Furthermore, as will be understood by those having skill in the art, the adhesive material can defined so as to include an adhesive protection layer 27 so that the adhesive protection layer defines the smooth surface that is level with the interfacial surfaces of the diamond mesas. The adhesive material 30 can also form a thin layer between the growth surfaces 26b of the diamond mesas 26 and the transfer substrate, as shown. Alternately, the growth surfaces 26b can lie directly on the transfer substrate 28.

Figure 4:
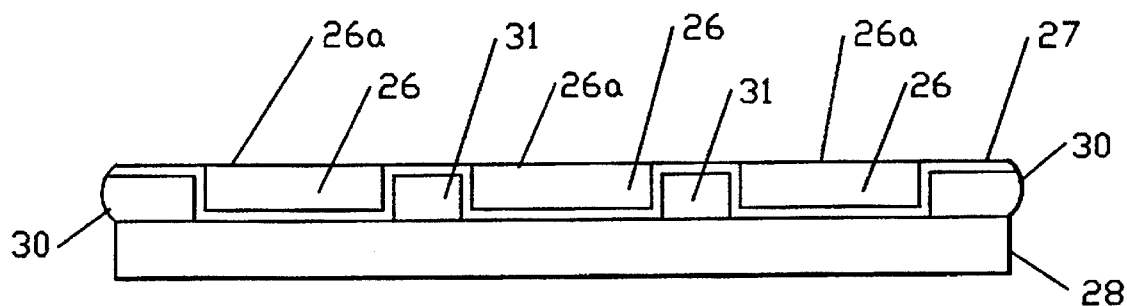
Figure 7:
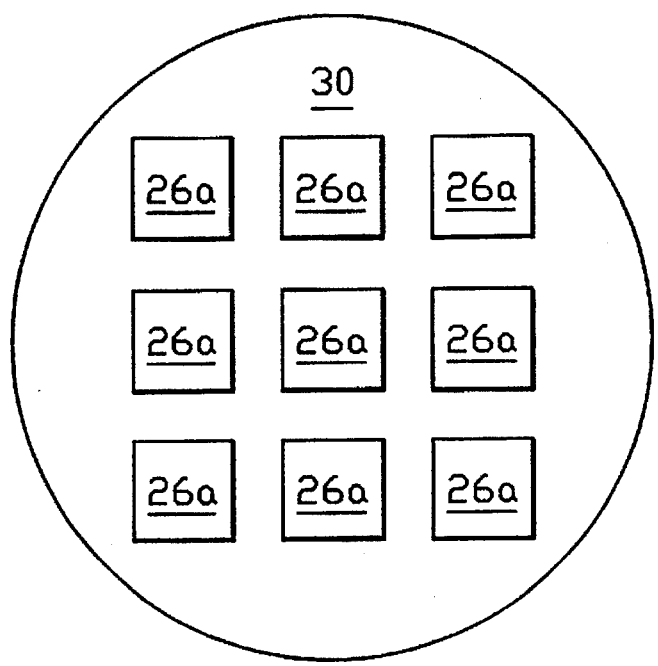
FIGS. 7-9 are respective top views of the diamond mesa structures of FIGS. 4-6.
Figure 8:
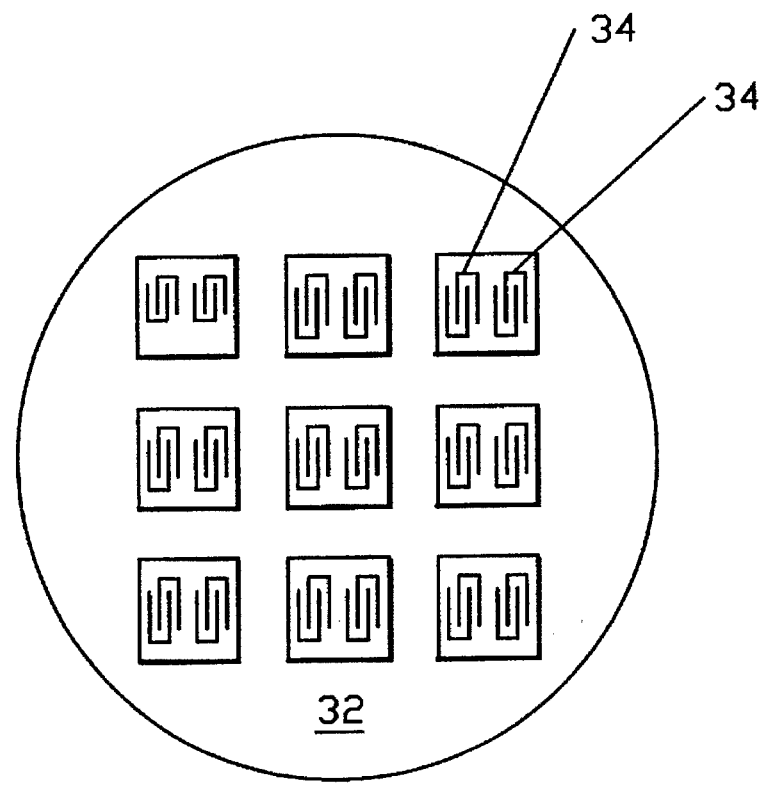

The sacrificial substrate 22 is then removed from the microelectronic structure as shown in cross-section in FIG. 4 and from the top in FIG. 7. The sacrificial substrate 22 can be removed by etching, lapping, or other methods known to those having skill in the art. The adhesive protection layer 27 protects the adhesive material 30 during the step of removing the sacrificial substrate 22.

As discussed above, the now exposed interfacial surfaces 26a of the diamond mesas 26 are smooth thereby allowing the formation of microelectronic devices having fine geometries and therefor requiring high resolution photolithographic processing. As discussed above, these interfacial surfaces 26a can have a surface roughness of less that 0.1 µm RMS and preferably less than 0.01 µm RMS. Accordingly, the interfacial surfaces of the diamond mesas can be smooth relative to the growth surfaces.

Furthermore, the adhesive material 30 forms a smooth surface which extends from the interfacial surfaces of the diamond mesas so that the resulting microelectronic structure has a continuous smooth top surface. Accordingly, the microelectronic structure of FIG. 4 requires no special handling procedures during subsequent processing steps. The smooth surface can facilitate state-of-the art photolithography, decrease the risk of mask damage in the case of contact photolithography, decrease distortion of high frequency signals, and decrease scattering of incident electromagnetic radiation. As discussed above, the adhesive material can be defined to include an adhesive protection layer.

The microelectronic structure of FIG. 4 can be used as a starting material in the production of microelectronic devices such as transistors, resistors, diodes, capacitors, thermistors, surface acoustic wave devices, sensors (such as piezoresistive diamond devices) and other microelectronic devices known to those having skill in the art. In addition, it may be preferred to store the microelectronic structure of FIG. 3 with the sacrificial substrate 22 still attached until there is a need to fabricate the microelectronic devices. Accordingly, the interfacial surfaces 26a of the diamond mesas 26 remain protected until production begins, and then the sacrificial layer can be removed to produce the structure of FIG. 4. The microelectronic structure can be sold with the sacrificial substrate and placed in inventory by the next level manufacturer. Then the removal of the sacrificial substrate 22 can be the first step in the production of microelectronic devices on the diamond mesas 26 so that the interfacial surfaces 26a of the diamond mesas remain protected until needed.

As an example, the production of a plurality of surface acoustic wave ("SAW") devices is shown in FIGS. 5–6 and 8–9. As shown in cross-section in FIG. 5 and from the top in FIG. 8, a piezoelectric layer 32 is formed on the exposed interfacial surfaces 26a of the diamond mesas 26. As shown, the piezoelectric layer 32 can extend uniformly across the microelectronic structure. The piezoelectric layer can be transparent allowing optical alignment to the diamond mesas 26. Alternately, the piezoelectric layer 32 can be selectively formed on the diamond mesas by selective deposition, by selective removal such as etching, or by other methods known to those having skill in the art.

Because the piezoelectric layer is formed on the smooth interfacial surfaces 26a of the diamond mesas 26, the piezoelectric layer 32 will also have a smooth surface. The piezoelectric layer can be ZnO, $LiNbO_3$, $LiTaO_3$, or any other piezoelectric material known to those having skill in the art.

Figure 5:
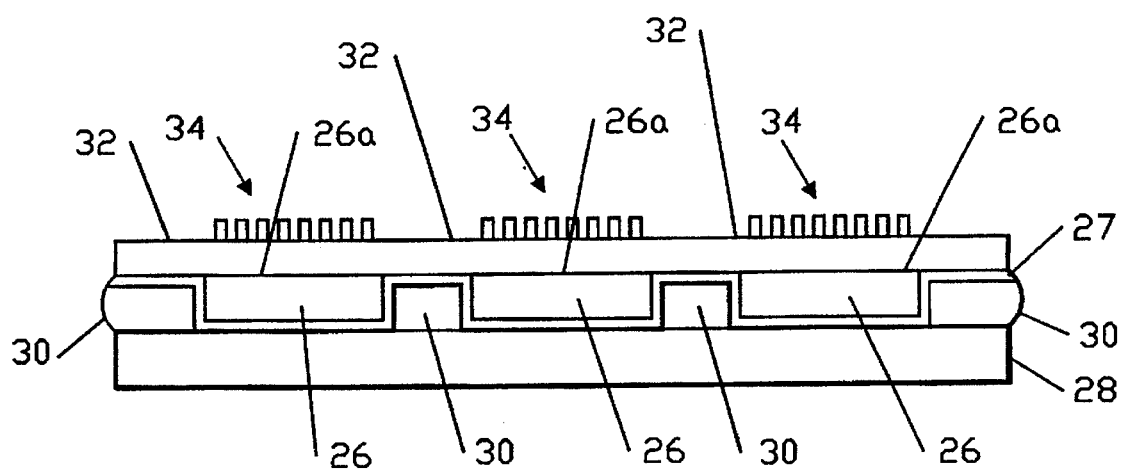

One or more pairs of comb-like interdigitated transducer ("IDT") electrodes 34 can be formed on each portion of the piezoelectric layer 32 opposite a diamond mesa 26. As shown in FIG. 5, the IDT electrodes can be formed on the piezoelectric layer 32 opposite the diamond mesas 26. Alternately, the IDT electrodes can be formed on the piezoelectric layer adjacent the diamond mesas. In addition, the SAW devices can include ground electrodes on the piezoelectric layer opposite the IDT electrodes. Various SAW device structures are disclosed, for example, in the following United States Patents: U.S. Pat. No. 4,952,832 to Imai et al. entitled "Surface Acoustic Wave Device"; U.S. Pat. No. 5,329,208 to Imai et al. entitled "Surface Acoustic Wave Device And Method For Producing The Same"; and U.S. Pat. No. 5,355,568 to Imai et al. entitled "Method Of Making A Surface Acoustic Wave Device". Still more SAW device structures are disclosed in U.S. patent application No. 08/322,710 to Dreifus et al. and entitled "Diamond Surface Acoustic Wave Devices and Associated Method." This application is assigned to the assignee of the present invention. Each of these references is hereby incorporated in their entirety herein by reference.

In the illustrated structure, each of the diamond mesas 26 has a piezoelectric layer 32 thereon, and two pairs of IDT electrodes 34 are formed on each of the piezoelectric layers 32. Accordingly, one pair of IDT electrodes 34 on each of the piezoelectric layers 32 can be used to generate a surface acoustic wave and the other pair of IDT electrodes 34 can be used to receive the surface acoustic wave. As shown, a plurality of these SAW devices can be formed on a single microelectronic structure according to the present invention. While two pairs of IDT electrodes 34, spaced a distance apart, are shown on each portion of the piezoelectric layer 32 opposite a diamond mesa 26, a SAW device such as a resonator can include integrated pairs of IDT electrodes 34 as will be understood by those having skill in the art.

Figure 6:
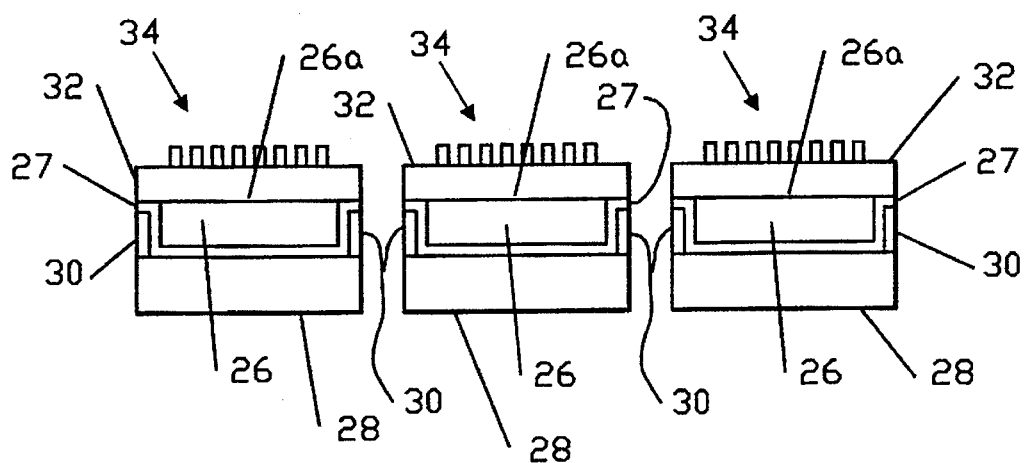
Figure 9:
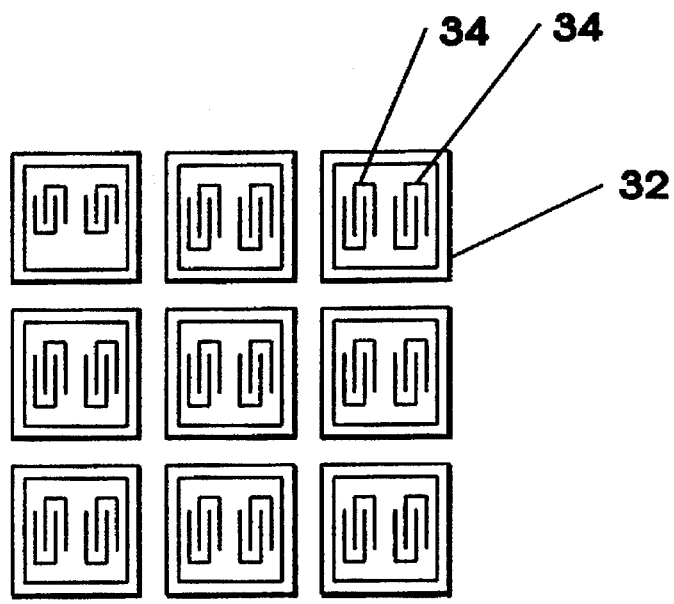

As shown in cross-section in FIG. 6 and from the top in FIG. 9, each of the diamond mesas 26 including a respective SAW device can be separated by dicing the microelectronic structure. This dicing can be achieved by sawing through the microelectronic structure. Because the diamond mesas 26 are spaced apart, the sawing can be done between the diamond mesas 26 thereby eliminating the need to saw through diamond.

In contrast, dicing a conventional bonded diamond structure, wherein a continuous diamond layer is fixed to a support substrate, may require sawing through the non-diamond layer and then using other techniques to dice the diamond layer. Because of the difficulty in dicing diamond, a separate technique such as laser ablation may be required to then dice the continuous diamond layer. This two step procedure may require additional processing steps as well as the purchase and maintenance of expansive laser ablation equipment. Furthermore, the laser ablation of diamond may create undesired particulate contamination. Accordingly, even when compared to the formation of diamond structures on diamond substrates, which may require separation by laser ablation, the structure of the present invention can be more cheaply diced by sawing. The microelectronic structure of the present invention can be diced by sawing in a single step thus reducing costs while producing relatively low levels of particulates.

Figure 10:
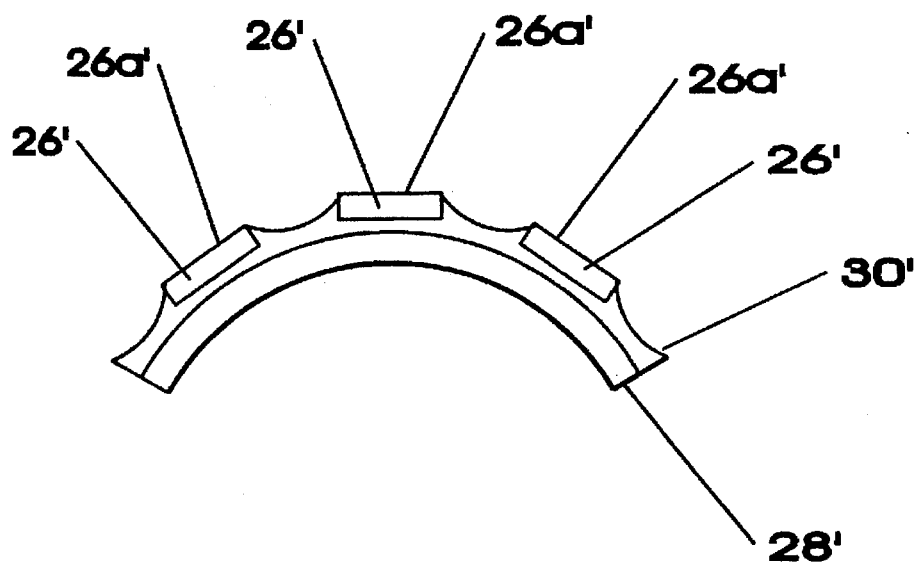
FIG. 10 is a cross-sectional view of diamond mesa structures on a flexible substrate according to the present invention.

The transfer substrate 28 can be a rigid insulating substrate thereby providing electrical and/or thermal isolation between adjacent diamond mesas. The transfer substrate can be electrically and/or thermally conducting. The adhesive material can also be electrically and/or thermally isolating or conducting. Furthermore, the adhesive material can act as an acoustic absorber when used with a SAW device. In addition, the transfer substrate 28' can be a flexible foil capable of being mounted to a non-planar object as illustrated in FIG. 10. In yet another alternative, the smooth diamond mesas can be used for mirror switching applications. For example, the transfer substrate can be a piezoelectric material which moves or tilts the smooth diamond mirrors thus allowing light to be switched.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A diamond-based structure comprising:

a sacrificial substrate having a face;

an array of spaced apart diamond mesas on said face of said sacrificial substrate; and a transfer substrate on said plurality of diamond mesas opposite said sacrificial substrate.

2. A diamond-based structure according to claim 1 further comprising an adhesive material between said sacrificial substrate and said transfer substrate wherein said adhesive material bonds said array of spaced apart diamond mesas to said transfer substrate.

3. A diamond-based structure according to claim 2 wherein sides of adjacent diamond mesas and surfaces of said sacrificial and transfer substrates define a void therebetween, and wherein said adhesive material fills said void.

4. A diamond-based structure according to claim 2 further comprising an adhesive protection layer between said adhesive layer and said sacrificial substrate.

5. A diamond-based structure according to claim 1 wherein each of said diamond mesas has a respective growth surface adjacent said transfer substrate and a respective interfacial surface adjacent said sacrificial substrate and wherein said respective interfacial surfaces are smooth relative to said growth surfaces.

6. A diamond-based structure according to claim 1 wherein said diamond mesas comprise randomly oriented polycrystalline diamond.

7. A diamond-based structure comprising:

a substrate having a face;

an adhesive material on said face of said substrate; and an array of spaced apart diamond mesas bonded to said substrate by said adhesive material;

wherein each of said diamond mesas has a respective growth surface adjacent said substrate and a respective interfacial surface opposite said substrate.

8. A diamond-based structure according to claim 7 wherein said respective interfacial surfaces are smooth relative to said growth surfaces.

9. A diamond-based structure according to claim 7 wherein adjacent diamond mesas define spaces therebetween, and wherein said adhesive material fills said spaces such that a surface of said adhesive material and surfaces of said diamond mesas opposite said substrate define a continuous smooth top surface of said diamond-based structure.

10. A diamond-based structure according to claim 7 wherein said diamond mesas comprise randomly oriented polycrystalline diamond.

11. A diamond-based structure according to claim 7 wherein said substrate comprises a flexible foil.

12. A diamond-based structure comprising:

a substrate having a face;

an adhesive material on said face of said substrate;

an array of spaced apart diamond mesas bonded to said substrate by said adhesive material; and a layer of a piezoelectric material on said diamond mesas opposite said substrate.

13. A diamond-based structure according to claim 12 further comprising at least one pair of interdigitated electrodes on said layers of said piezoelectric material, thereby defining a surface acoustic wave device on each of said diamond mesas.

14. A diamond-based structure comprising:

a substrate having a face;

an adhesive material on said face of said substrate;

an array of spaced apart diamond mesas bonded to said substrate by said adhesive material; and an adhesive protection layer on said adhesive material between said spaced apart diamond mesas.

* * * * *